(12) United States Patent
Chou et al.

(10) Patent No.: US 8,358,165 B2
(45) Date of Patent: Jan. 22, 2013

(54) ULTRA-LOW VOLTAGE LEVEL SHIFTING CIRCUIT

(75) Inventors: Shao-Yu Chou, Chu Pei (TW); Yen-Huei Chen, Hsinchu (TW); Jui-Jen Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/308,035

(22) Filed: Nov. 30, 2011

(65) Prior Publication Data

US 2012/0306537 A1  Dec. 6, 2012

Related U.S. Application Data

(62) Division of application No. 12/273,365, filed on Nov. 18, 2008, now Pat. No. 8,102,199.

(51) Int. Cl.
*H03L 5/00* (2006.01)
(52) U.S. Cl. ........ 327/333; 326/80; 326/81; 365/189.11
(58) Field of Classification Search .................. 327/333; 326/80, 81, 68; 365/189.11
See application file for complete search history.

(56) References Cited

U.S. PATENT DOCUMENTS 5,959,899 A * 9/1999 Sredanovic .............. 365/189.02

* cited by examiner

*Primary Examiner* — Lincoln Donovan
*Assistant Examiner* — Shikha Goyal
(74) *Attorney, Agent, or Firm* — K&L Gates LLP (57) ABSTRACT

A voltage level shifter having an internal low voltage power supply (VCCL) and an external high voltage power supply (VCCH) includes a first PMOS transistor and a second PMOS transistor each with a source connected to the VCCH, a gate of the first PMOS transistor being coupled to a drain of the second PMOS transistor, and a gate of the second PMOS transistor being coupled to a drain of the first PMOS transistor. The voltage level shifter further includes a first NMOS transistor with a source connected to a ground (VSS) and a gate connected to a first signal swinging between the VCCL and the VSS, and a first blocking device coupled between the drain of the first PMOS transistor and a drain of the first NMOS transistor, such that the voltage level shifter can operate at a lower VCCL.

11 Claims, 7 Drawing Sheets

ULTRA-LOW VOLTAGE LEVEL SHIFTING CIRCUIT

CROSS REFERENCE TO RELATED APPLICATION

This application is a Divisional Application of U.S. Ser. No. 12/273,365, filed on Nov. 18, 2008, entitled: ULTRA-LOW VOLTAGE LEVEL SHIFTING CIRCUIT, which is now pending.

BACKGROUND

The present invention relates generally to integrated circuit (IC) design, and more particularly to voltage level shifter designs.

In a deep submicron technology for a typical IC chip, device feature sizes, such as gate oxide thickness and channel length, have greatly reduced. In order to work with such small geography devices, the power supply voltage have to be lowered, otherwise the gate oxide may breakdown and the transistor channel may punch through. For instance, for a 90 nm technology, the power supply voltage is about 1.0V. However, in a system level, i.e., outside the IC chip, a power supply voltage may still be 2.5V or 3.3V. In order to allow such deep submicron IC chip to properly work in the high voltage system, voltage level shifters have to be employed to shift an external high voltage signal to a corresponding internal low voltage signal, and to shift an internal low voltage signal to a corresponding external high voltage signal.

Figure 1:
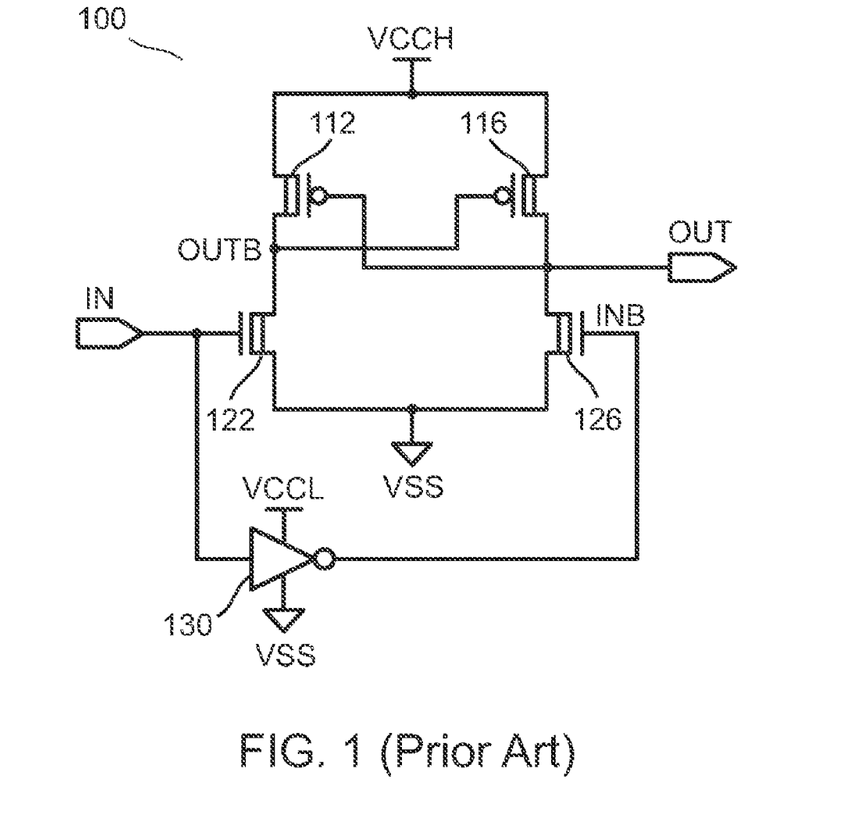
FIG. 1 is a schematic diagram illustrating a conventional low-to-high voltage level shifter.

FIG. 1 is a schematic diagram illustrating a conventional low-to-high voltage level shifter 100. The voltage level shifter 100 comprises a pair of PMOS transistors 112 and 116, a pair of NMOS transistors 122 and 126, and an inverter 130. These devices are connected as a cross-latch. Specifically, the PMOS transistor 112 and the NMOS transistor 122 are serially connected between an external power supply VCCH and a ground VSS, so are the PMOS transistor 116 and NMOS transistor 126. A gate of the PMOS transistor 112 is connected to the common drain of the PMOS transistor 116 and the NMOS transistor 126. A gate of the PMOS transistor 116 is connected to the common drain of the PMOS transistor 112 and the NMOS transistor 122. An input node IN is connected to a gate of the NMOS transistor 122, and to a gate of the NMOS transistor 126 through the inverter 130. An output node OUT is connected to the common drain of the PMOS transistor 116 and the NMOS transistor 126. A skilled in the art would immediately recognize that the voltage level shifter 100 functions as a two serially connected inverters from the input IN and output OUT point of view. For instance, when the input node IN is at a logic HIGH, the NMOS transistor 122 and the PMOS transistor 116 will be turned on, and the NMOS transistor 126 and the PMOS transistor 112 will be turned off, thus the output node OUT will be at the logic HIGH. However, the input node IN operates at an internal voltage between the VSS and a VCCL which is lower than the VCCH, while the output node OUT operates at an external voltage between the VSS and the VCCH. PMOS transistors 112 and 116 and NMOS transistors 122 and 126, exposing to the VCCH, are high voltage transistors with thick gate oxide, etc. The inverter 130, exposing only to the VCCL, is made of low voltage transistors with thin gate oxide, etc. With a proper adjustment of the threshold voltages of the NMOS transistors 122 and 126, the voltage level shifter 100 can achieve a voltage transition point around VCCL/2.

Referring again to FIG. 1, the node OUT achieves voltage level transition, like in an ordinary inverter, through on-and-off switching by the PMOS transistor 116 and the NMOS transistor 126. Specifically, assuming in a prior state, the node OUT is in a logic HIGH, then the PMOS transistor 116 is on, and the NMOS 126 transistor is off. In the new state, the node OUT turns to a logic LOW, then the PMOS transistor 116 is switched from on to off, and the NMOS transistor is switched from off to on. During the transition during, both the PMOS transistor 116 and the NMOS transistor 126 are on and one of the transistors fights against the transition. A successful transition depends on a proper balance of strength between the PMOS transistor 116 and the NMOS transistor 126. The same is true for the PMOS transistor 112 and the NMOS transistor 122. In the voltage level shifter 100, the voltage at the nodes IN and INB can only reach the VCCL, which cannot fully turns on or forcefully shut off the high voltage NMOS transistor 122 or 126. The lower the VCCL is, the weaker the NMOS transistor 122 or 126 is, and eventually the voltage level shifter 100 will fail to make the transition. Therefore, the poor strength of the NMOS transistors 122 and 126 is a bottleneck that limits how low the VCCL can go. Typically, the conventional voltage level shifter 100 can operate at 0.65V of the VCCL, when the VCCH is about 1.1V. However, some advanced IC systems require a proper working when the VCCL is as low as 0.4V, which cannot be achieved by the conventional voltage level shifter 100.

As such, what is desired is an improved voltage level shifter that can operate at the lower VCCL by overcoming the weakness in the NMOS transistors 122 and 126 of FIG. 1.

SUMMARY

The present invention discloses a voltage level shifting circuit. According to one aspect of the present invention, a voltage level shifting circuit for an integrated circuit system having an internal low voltage power supply (VCCL) and an external high voltage power supply (VCCH) includes a first and a second PMOS transistor each with a source connected to the VCCH, a gate of the first PMOS transistor being coupled to a drain of the second PMOS transistor, and a gate of the second PMOS transistor being coupled to a drain of the first PMOS transistor. The voltage level shifting circuit further includes a first NMOS transistor with a source connected to a ground (VSS) and a gate connected to a first signal swinging between the VCCL and the VSS, and a first blocking device coupled between the drain of the first PMOS transistor and a drain of the first NMOS transistor. The first blocking device is configured to conduct active current between the drains of the first PMOS transistor and the first NMOS transistor when the first signal is in static state or transitions from a logic HIGH to a logic LOW. The first blocking device is further configured to shut off active current between the drains of first PMOS transistor and the first NMOS transistor when the first signal transitions from the logic LOW to the logic HIGH.

According to another aspect of the present invention, a voltage level shifting circuit for an integrated circuit system having an internal low voltage power supply (VCCL) and an external high voltage power supply (VCCH) includes a first NMOS transistor with a source connected to a ground (VSS) and a gate connected to a first signal swinging between the VCCL and the VSS. The voltage level shifting circuit further includes a first and a second PMOS transistor, a drain and a gate of the first PMOS transistor being coupled to a drain of the first NMOS transistor and a drain of the second PMOS transistor, respectively, a gate of the second PMOS transistor being coupled to a drain of the first PMOS transistor. In addition, the voltage level shifting circuit includes a first blocking device coupled between the VCCH and a source of the first PMOS transistor, the first blocking device being configured to conduct active current between the VCCH and the source of the first PMOS transistor when the first signal is in static state or transitions from a logic HIGH to a logic LOW, and the first blocking device being configured to shut off active current between the VCCH and the source of the first PMOS transistor when the first signal transitions from the logic LOW to the logic HIGH. Yet, the voltage level shifting circuit includes a second blocking device coupled between the VCCH and a source of the second PMOS transistor, the second blocking device being configured to conduct active current between the VCCH and the source of the second PMOS transistor when the first signal is in static state or transitions from a logic HIGH to a logic LOW, and the second blocking device being configured to shut off active current between the VCCH and the source of the second PMOS transistor when the first signal transitions from the logic LOW to the logic HIGH.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein.

DESCRIPTION

As discussed in the background section, a limiting factor for the voltage split between the VCCH and the VCCL in the conventional voltage level shifting circuit 100 as shown in FIG. 1 is the lack of strength in the NMOS transistors 122 and 126 during a state transition. This invention describes voltage level shifting circuits with various pull-up balancing circuits, so that the PMOS transistors and the NMOS transistors are more balanced and the VCCH and VCCL can have greater split.

Figure 2A:
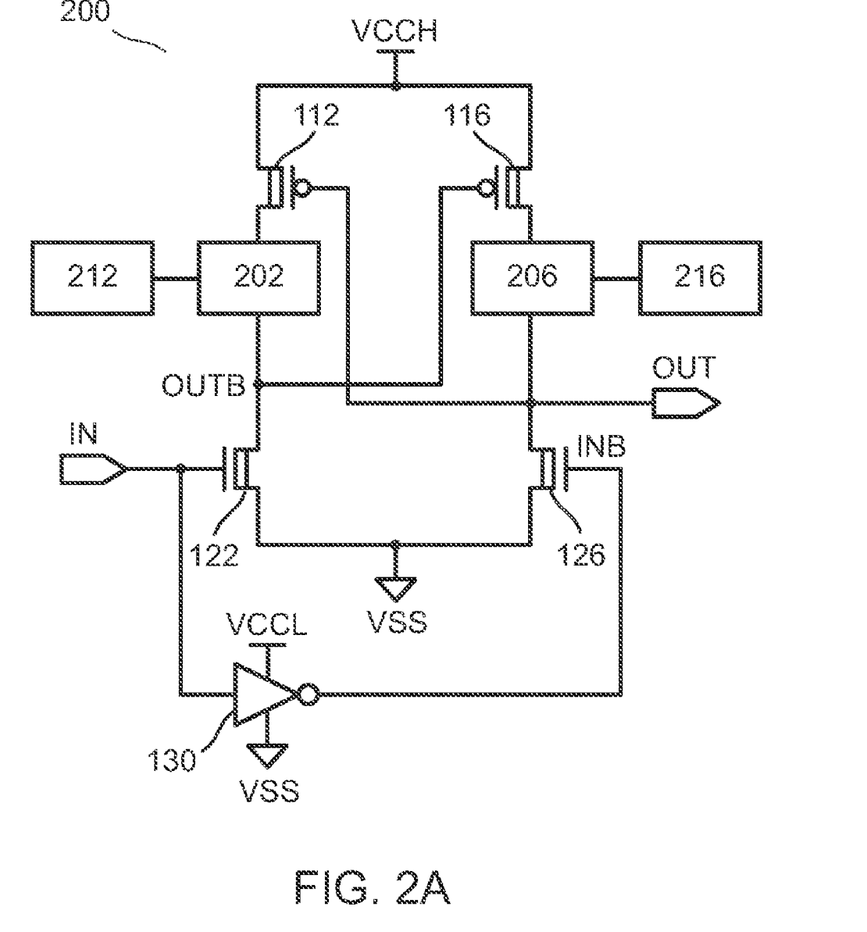
FIGS. 2A and 2B are schematic diagrams illustrating low-to-high voltage level shifters with pull-up blocking circuits according to a first embodiment of the present invention.
Figure 2B:
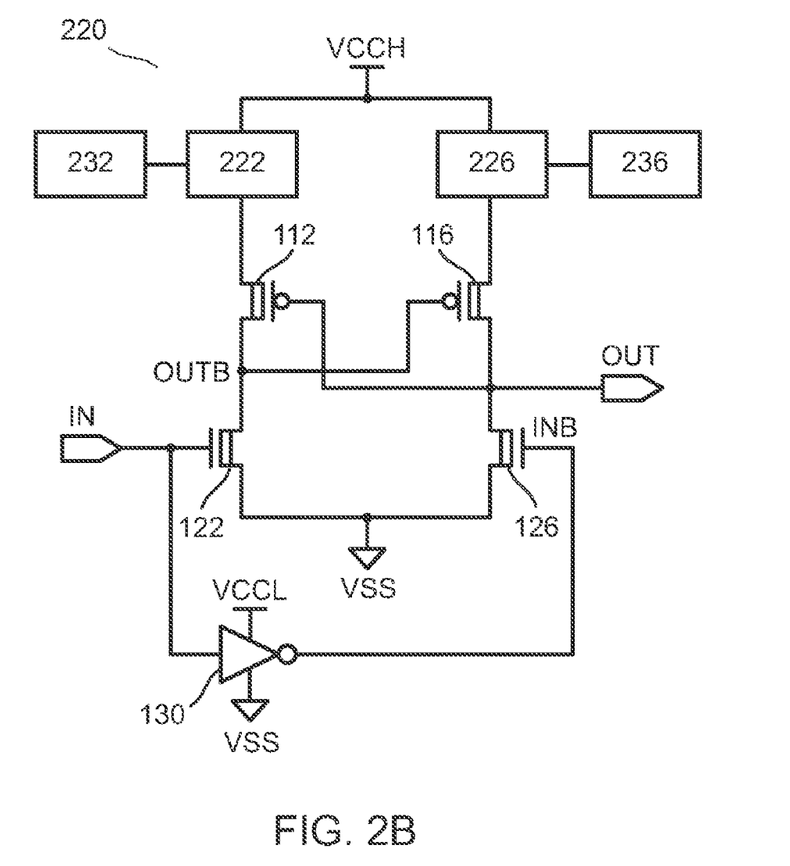

FIGS. 2A and 2B are schematic diagrams illustrating low-to-high voltage level shifters 200 and 220 with pull-up blocking circuits according to a first embodiment of the present invention. Referring to FIG. 2A, the voltage level shifter 200 is identical to the voltage level shifter 100 of FIG. 1 except that the blocking circuit 202, which is controlled by a control circuit 212, is inserted between the PMOS transistor 112 and the NMOS transistor 122, and the blocking circuit 206, which is controlled by a control circuit 216, is inserted between the PMOS transistor 116 and the NMOS transistor 126. A function of the blocking circuit 202 and 206 is to block a pull-up path to a node that is to be pulled down to the VSS during a state transition. For instance, when the node IN transitions from the logic LOW to the logic HIGH, the NMOS transistor 122 is turned on, and a node OUTB transitions from the logic HIGH to the logic LOW. The PMOS transistor 112 is previously on to hold the node OUTB at the logic HIGH. In order to prevent a fight by the PMOS transistor 112 against the pull-down by the NMOS transistor 122, the blocking circuit 202 shuts up a path between the PMOS transistor 112 and the node OUTB, so that the NMOS transistor 122 can easily pulls down the node OUTB to the VSS. At the same time, the NMOS transistor 126 is turned off. The node OUT transitions from the logic LOW to the logic HIGH by a pull-up of the PMOS transistor 116. The blocking circuit 206 remains conducting. The PMOS transistor 116 is turned on by the voltage lowering of the node OUTB. Similarly, when the node IN transitions from the logic HIGH to the logic LOW, the blocking circuit 202 will remain conducting, and the blocking circuit 206 shuts off, so that the NMOS transistor 126 can easily transition the node OUT from the logic HIGH to the logic LOW.

When the state transition is completed, i.e., the voltage level shifter 200 is in static state, both the blocking circuit 202 and 206 are conduction circuits, the voltage level shifter 200 is functionally the same as the voltage level shifter 100 of FIG. 1.

Referring to FIG. 2B, the voltage level shifter 220 is identical to the voltage level shifter 100 of FIG. 1 except that a pull-up blocking circuit 222, which is controlled by a control circuit 232, is inserted between the VCCH and the PMOS transistor 112, and a pull-up blocking circuit 226, which is controlled by a control circuit 236, is inserted between the VCCH and the PMOS transistor 116. A function of the blocking circuit 222 and 226 is to block a pull-up path to a node that is to be pulled down to the VSS during a state transition, just the same as the blocking circuit 202 and 206 of FIG. 2A. A skilled in the art would realize that FIG. 2B is to illustrate alternative locations for inserting the pull-up blocking circuits that achieve the same result as the voltage level shifter 200 of FIG. 2A. In fact, the blocking circuits 222 and 226 and their corresponding control circuit 232 and 236 of FIG. 2B and the blocking circuit 202 and 206 and their corresponding control circuit 212 and 216 of FIG. 2A can be implemented by the same circuits, respectively, i.e., the blocking circuit 222 of FIG. 2B can be identical to the blocking circuit 202 of FIG. 2A, etc.

Figure 3:
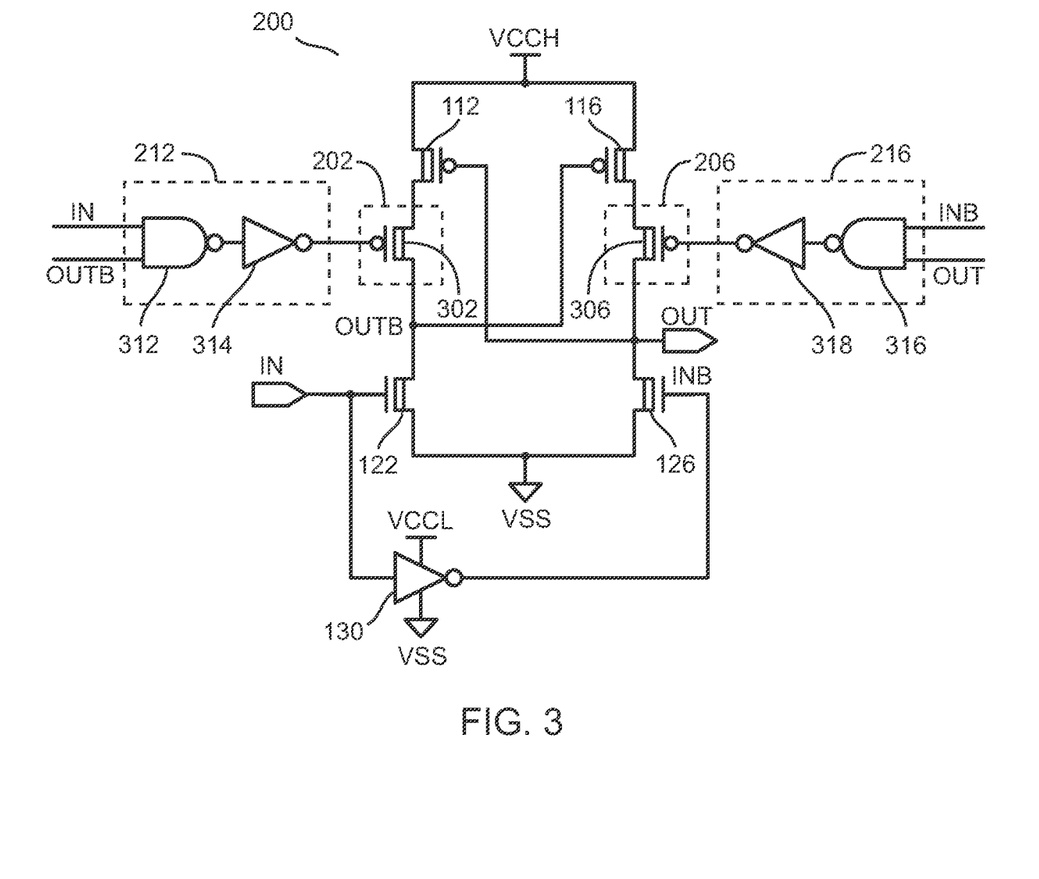
FIG. 3 is a schematic diagram illustrating an implementation of the voltage level shifter of FIG. 2A.

FIG. 3 is a schematic diagram illustrating an implementation of the voltage level shifter 200 of FIG. 2A. The blocking circuit 202 is implemented by a PMOS transistor 302 with a source connected to a drain of the PMOS transistor 112, and a drain connected to a drain of the NMOS transistor 122. The blocking circuit 206 is implemented by a PMOS transistor 306 with a source connected to a drain of the PMOS transistor 116, and a drain connected to a drain of the NMOS transistor 126. The control circuit 212 is implemented by a NAND gate 312 and an inverter 314 serially connected to a gate of the blocking PMOS transistor 302. Two inputs of the NAND gate 312 are coupled to the nodes IN and OUTB, respectively. The control circuit 216 is implemented by a NAND gate 316 and an inverter 318 serially connected to a gate of the blocking PMOS transistor 306. Two inputs of the NAND gate 316 are coupled to the nodes INB and OUT, respectively. It is well known that both the control circuits 212 and 216 have a logic function as depicted by following truth table 1.

TABLE 1

| In[1] | In[0] | Out |
|---|---|---|
| LOW | LOW | LOW |
| LOW | HIGH | LOW |
| HIGH | LOW | LOW |
| HIGH | HIGH | HIGH |

Herein the term "coupled" means directly connected or connected through another component, but where that added another component supports the circuit function.

Referring again to FIG. 3, at an onset of a transition by the node IN from the logic LOW to the logic HIGH, both the nodes IN and OUTB are at the logic HIGH. The control circuit 212 outputs the logic HIGH, which turns off the blocking PMOS transistor 302, so that the NMOS transistor 122 can pull down the node OUTB more easily without fighting the pull-up by the PMOS transistor 112. Also at the onset of the transition by the node IN from the logic LOW to the logic HIGH, both the node INB and OUT are at the logic LOW. The control circuit 216 outputs the logic LOW, which turns on the blocking PMOS transistor 306 to allow the PMOS transistor 116 to pull up the node OUT. Similarly, at an onset of a transition by the node IN from the logic HIGH to the logic LOW, the blocking PMOS transistor 302 is on and the blocking PMOS transistor 306 is off. The pull-up by the PMOS transistor 116 is blocked, so that the node OUT can be more easily pulled down to the VSS by the NMOS transistor 126.

Referring again to FIG. 3, after a certain period of time, the nodes will transition into a static state. In a static state, the nodes IN and OUTB are always complimentary to each other, and so are the nodes INB and OUT. Therefore, the control circuits 212 and 216 always output the logic LOW, and thus turn on the blocking PMOS transistors 302 and 306, respectively, in a static state. In this case, the blocking PMOS transistors 302 and 306 conduct, and the voltage level shifter 200 functions the same as the voltage level shifter 100 of FIG. 1.

Figure 4:
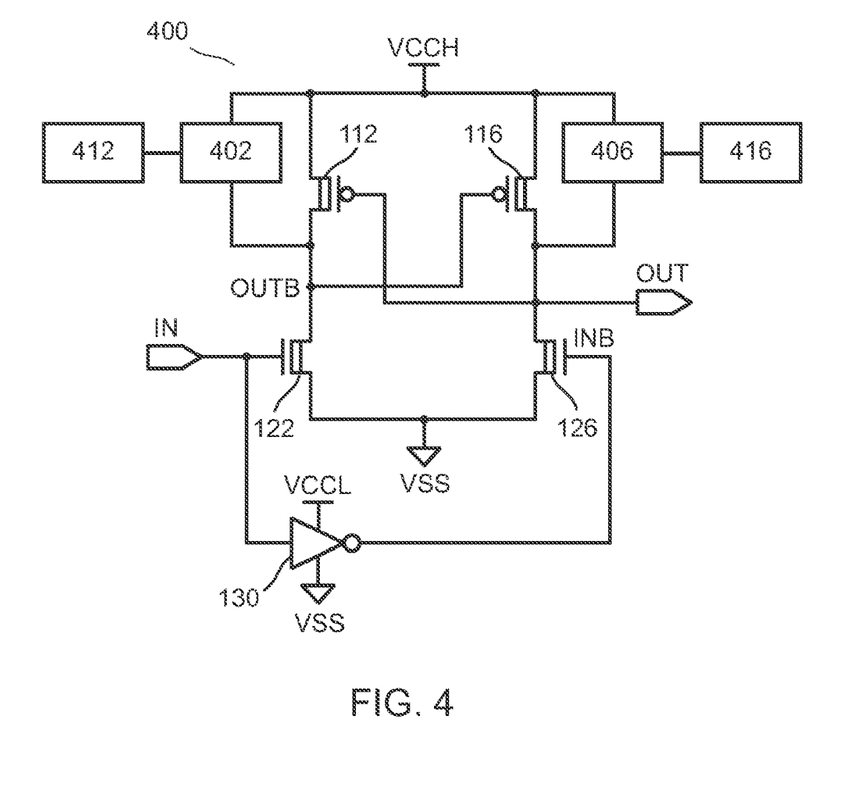
FIG. 4 is a schematic diagram illustrating a low-to-high voltage level shifter with additional pull-up circuits according to a second embodiment of the present invention.

FIG. 4 is a schematic diagram illustrating low-to-high voltage level shifters 400 with additional pull-up circuits 402 and 406 according to a second embodiment of the present invention. The voltage level shifter 400 is identical to the voltage level shifter 100 of FIG. 1 except that a pull-up circuit 402, which is controlled by a control circuit 412, is connected between the VCCH and the node OUTB, in parallel with the PMOS transistor 112; and a pull-up circuit 406, which is controlled by a control circuit 416, is connected between the VCCH and the node OUT, in parallel with the PMOS transistor 116. During a static state the pull-up circuits 402 and 406 are turned off, the voltage level shifter 400 functions exactly the same as the voltage level shifter 100 of FIG. 1. During a state transition period, one of the pull-up circuits 402 and 406 is turned on to provide additional pull-up strength to a node that needs to be pulled up to the VCCH, while the other pull-up circuits 402 or 406 remain turned off to allow the other node to be pulled down to the VSS. More specifically, when the node IN transitions from the logic LOW to the logic HIGH, the node OUTB needs to be pulled down to the VSS, and the node OUT needs to be pulled up to the VCCH. Then the control circuit 412 turns off the pull-up circuit 402; and the control circuit 416 turns on the pull-up circuit 406. During this transition period, the PMOS transistor 112 is turned from on to off by the node OUT; and the PMOS transistor 116 is turned from off to on. With the addition of the pull-up circuit 406, the node OUT can be pulled up to the VCCH more easily. Similarly, when the node IN transitions from the logic HIGH to the logic LOW, the node OUTB needs to be pulled up to the VCCH, and the node OUT needs to be pulled down to the VSS. The pull-up circuit 402 will be turned on to assist the pull-up at the node OUTB. The pull-up circuit 406 will remain turned off for not interfering with the pull-down at the node OUT.

Figure 5:
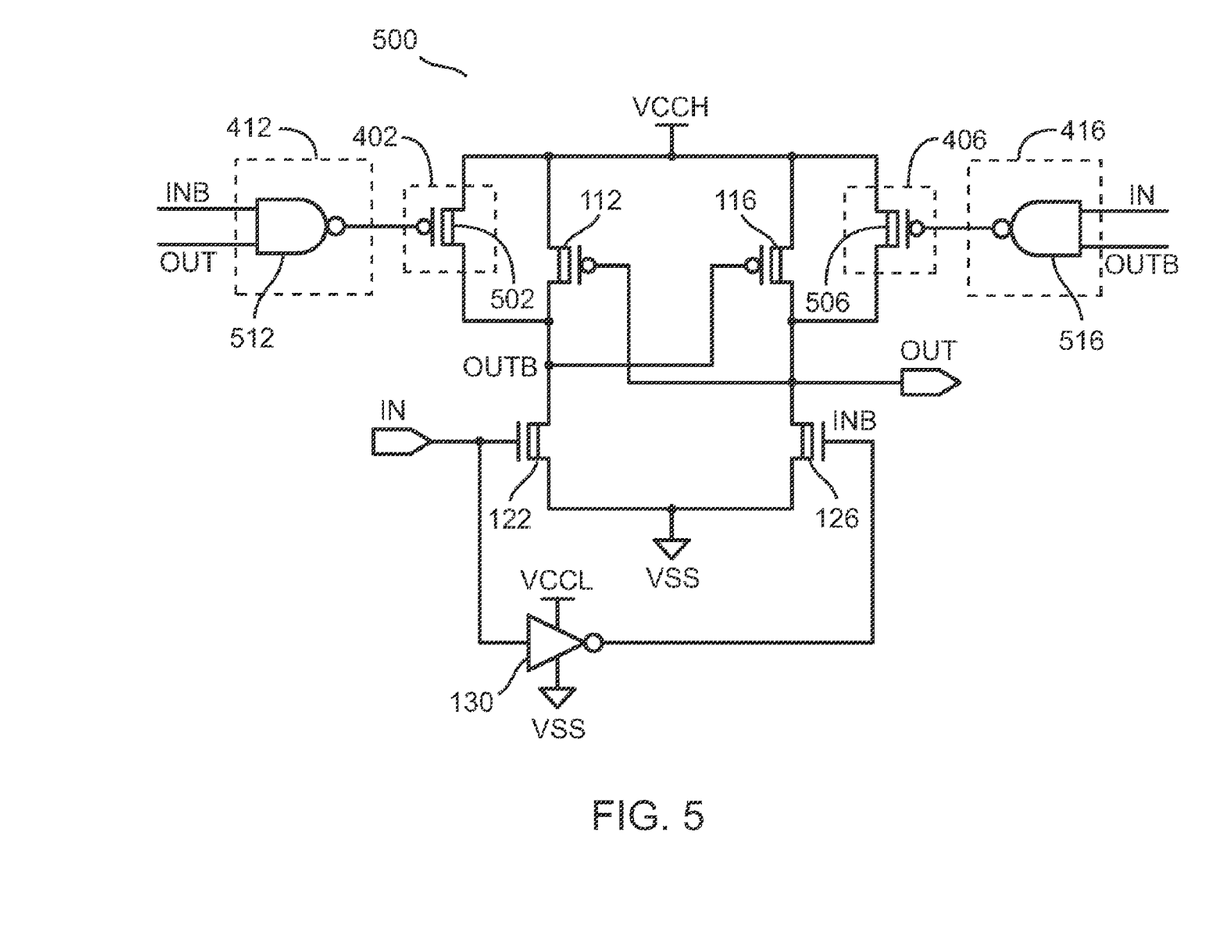
FIG. 5 is a schematic diagram illustrating an implementation of the low-to-high voltage level shifter of FIG. 4.

FIG. 5 is a schematic diagram illustrating an implementation of the low-to-high voltage level shifter 400 of FIG. 4. The pull-up circuit 402 is implemented by a PMOS transistor 502 with a source connected to the VCCH, and a drain connected to the node OUTB. The pull-up circuit 406 is implemented by a PMOS transistor 506 with a source connected to the VCCH, and a drain connected to the node OUT. The control circuit 412 is implemented by a NAND gate 512 with an output connected to a gate of the pull-up PMOS transistor 502. Two inputs of the NAND gate 512 are coupled to the nodes INB and OUT, respectively. The control circuit 416 is implemented by a NAND gate 516 with an output connected to a gate of the pull-up PMOS transistor 506. Two inputs of the NAND gate 516 are coupled to the nodes IN and OUTB, respectively. It is well known that both the control circuits 412 and 416 have a logic function as depicted by following truth table 2.

TABLE 2

| In[1] | In[0] | Out |
|---|---|---|
| LOW | LOW | HIGH |
| LOW | HIGH | HIGH |
| HIGH | LOW | HIGH |
| HIGH | HIGH | LOW |

Referring again to FIG. 5, at an onset of a transition by the node IN from the logic LOW to the logic HIGH, both the nodes INB and OUT are at the logic LOW. The control circuit 412 outputs the logic HIGH, which turns off the pull-up PMOS transistor 502, so that the NMOS transistor 122 can pull down the node OUTB normally fighting only the pull-up by the PMOS transistor 112. Also at the onset of the transition by the node IN from the logic LOW to the logic HIGH, both the node INB and OUT are at the logic HIGH. The control circuit 416 outputs the logic LOW, which turns on the pull-up PMOS transistor 506 which pulls up the node OUT to the VCCH. The PMOS transistor 116 is turned on by the pulled-down node OUTB. With the assistant of the PMOS transistor 506, the node OUT will be more forcefully pulled up to the VCCH. Therefore the state transition will be made easier. Similarly, at an onset of a transition by the node IN from the logic HIGH to the logic LOW, the pull-up PMOS transistor 502 is on and the pull-up PMOS transistor 506 is off. The pull-up by the PMOS transistor 112 will be augmented by the pull-up by the PMOS transistor 502, so that the node OUTB can be more easily pulled up to the VCCH and thus the node OUT to the VSS.

Referring again to FIG. 5, after a certain period of time, the nodes will transition into a static state. In a static state, the nodes INB and OUT are always complimentary to each other, and so are the nodes IN and OUTB. Therefore, the control circuits 412 and 416 always output the logic HIGH, and thus turn off the pull-up PMOS transistors 502 and 506, respectively, in a static state. In this case, the both the pull-up PMOS transistors 502 and 506 are off, and the voltage level shifter 500 functions the same as the voltage level shifter 100 of FIG. 1.

Figure 6:
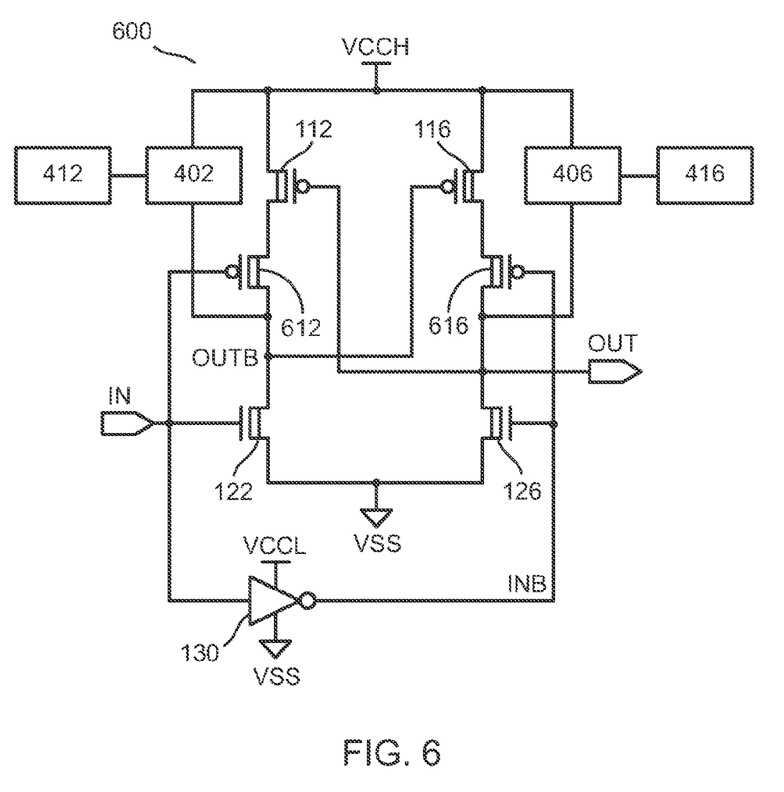
FIG. 6 is a schematic diagram illustrating a low-to-high voltage level shifter with additional pull-up circuits according to a third embodiment of the present invention.

FIG. 6 is a schematic diagram illustrating a low-to-high voltage level shifter 600 with additional pull-up circuits 402 and 406 according to a third embodiment of the present invention. The voltage level shifter 600 is identical to the voltage level shifter 400 except a PMOS transistor 612 is inserted between the PMOS transistor 112 and the NMOS transistor 122; and a PMOS transistor 616 is inserted between the PMOS transistor 116 and the NMOS transistor 126. A source, drain and gate of the PMOS transistor 612 are connected to the drain of the PMOS transistor 112, the node OUTB and the node IN, respectively. A source, drain and gate of the PMOS transistor 616 is connected to the drain of the PMOS transistor 116, the node OUT and the node INB. In FIG. 4, the node OUTB is inverted from the node IN by the NMOS transistor 122, and the node OUT is inverted from the node INB by the NMOS transistor 126. In FIG. 6, the node OUTB is instead inverted from the node IN by an inverter formed by the PMOS transistor 612 and the NMOS transistor 122; the node OUT is instead inverted from the node INB by an inverter formed by the PMOS transistor 616 and the NMOS transistor 126. Apparently, the voltage level shifter 600 of FIG. 6 functions the same as the voltage level shifter 400 of FIG. 4.

Although the present disclosure discusses only the circuit structure and the working mechanisms of the voltage level shifters according to the embodiments of the present invention, a skilled in the art would realize that when selecting transistors for the voltage level shifters, their voltage tolerances need to be properly determined. When a transistor is exposed to the VCCH, it has to be a high voltage transistor. When a transistor is exposed to only the VCCL, it can be a low voltage transistor.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A voltage level shifting circuit for an integrated circuit system having an internal low voltage power supply (VCCL) and an external high voltage power supply (VCCH), the voltage level shifting circuit comprising:
   a first and a second PMOS transistor each with a source connected to the VCCH, a gate of the first PMOS transistor being coupled to a drain of the second PMOS transistor, and a gate of the second PMOS transistor being coupled to a drain of the first PMOS transistor;
   a first NMOS transistor with a source connected to a ground (VSS) and a gate connected to a first signal swinging between the VCCL and the VSS; and
   a first blocking device coupled between the drain of the first PMOS transistor and a drain of the first NMOS transistor, the first blocking device being configured to conduct active current between the drains of the first PMOS transistor and the first NMOS transistor when the first signal is in static state or transitions from a logic HIGH to a logic LOW, and the first blocking device being configured to shut off active current between the drains of first PMOS transistor and the first NMOS transistor when the first signal transitions from the logic LOW to the logic HIGH.

2. The voltage level shifting circuit of claim 1, wherein the first and second PMOS transistors and the first NMOS transistor are high voltage transistors.

3. The voltage level shifting circuit of claim 1, wherein the first blocking device is a high voltage PMOS transistor with a source connected to the drain of the first PMOS transistor and a drain connected to the drain of the first NMOS transistor.

4. The voltage level shifting circuit of claim 1 further comprising:
   a second NMOS transistor with a source connected to the VSS and a gate connect to a second signal complementary to the first signal, the second signal swinging between the VCCL and the VSS; and
   a second blocking device coupled between the drain of the second PMOS transistor and a drain of the second NMOS transistor, the second blocking device being configured to conduct active current between the drains of the second PMOS transistor and the second NMOS transistor when the second signal is in static state or transitions from a logic HIGH to a logic LOW, and the second blocking device being configured to shut off active current between the drains of second PMOS transistor and the second NMOS transistor when the second signal transitions from the logic LOW to the logic HIGH.

5. The voltage level shifting circuit of claim 4, wherein the second NMOS transistor is a high voltage transistor.

6. The voltage level shifting circuit of claim 4, wherein the second blocking device is a high voltage PMOS transistor with a source connected to the drain of the second PMOS transistor and a drain connected to the drain of the second NMOS transistor.

7. A voltage level shifting circuit for an integrated circuit system having an internal low voltage power supply (VCCL) and an external high voltage power supply (VCCH), the voltage level shifting circuit comprising:
   a first NMOS transistor with a source connected to a ground (VSS) and a gate connected to a first signal swinging between the VCCL and the VSS;
   a first and a second PMOS transistor, a drain and a gate of the first PMOS transistor being coupled to a drain of the first NMOS transistor and a drain of the second PMOS transistor, respectively, a gate of the second PMOS transistor being coupled to a drain of the first PMOS transistor;
   a first blocking device coupled between the VCCH and a source of the first PMOS transistor, the first blocking device being configured to conduct active current between the VCCH and the source of the first PMOS transistor when the first signal is in static state or transitions from a logic HIGH to a logic LOW, and the first blocking device being configured to shut off active current between the VCCH and the source of the first PMOS transistor when the first signal transitions from the logic LOW to the logic HIGH, wherein an output of a first NAND gate is connected to the first blocking device; and
   a second blocking device coupled between the VCCH and a source of the second PMOS transistor, the second blocking device being configured to conduct active current between the VCCH and the source of the second PMOS transistor when the first signal is in static state or transitions from a logic HIGH to a logic LOW, and the second blocking device being configured to shut off active current between the VCCH and the source of the second PMOS transistor when the first signal transitions from the logic LOW to the logic HIGH, wherein an output of a second NAND gate is connected to the second blocking device.

8. The voltage level shifting circuit of claim 7, wherein the first and second PMOS transistors and the first NMOS transistor are high voltage transistors.

9. The voltage level shifting circuit of claim 7, wherein both the first and second blocking device are high voltage PMOS transistors each with a source connected to the VCCH, and a drain of the first blocking PMOS transistor is connected to the source of the first PMOS transistor and a drain of the second blocking PMOS transistor is connected to the source of the second PMOS transistor.

10. The voltage level shifting circuit of claim 7 further comprising a second NMOS transistor with a source connected to the VSS, a drain connected to the drain of the second PMOS transistor and a gate connect to a second signal complementary to the first signal, the second signal swinging between the VCCL and the VSS.

11. The voltage level shifting circuit of claim 10, wherein the second NMOS transistor is a high voltage transistor.

* * * * *